United States Patent
Wang et al.

(10) Patent No.: US 11,697,588 B2
(45) Date of Patent: Jul. 11, 2023

(54) STRUCTURE FOR MICROELECTROMECHANICAL SYSTEMS (MEMS) DEVICES TO CONTROL PRESSURE AT HIGH TEMPERATURE

(71) Applicant: Taiwan Semiconductor Manufacturing Company, Ltd., Hsin-Chu (TW)

(72) Inventors: Yi-Ren Wang, New Taipei (TW); Shing-Chyang Pan, Jhudong Township (TW); Yuan-Chih Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 23 days.

(21) Appl. No.: 17/542,679

(22) Filed: Dec. 6, 2021

(65) Prior Publication Data

US 2022/0089434 A1 Mar. 24, 2022

Related U.S. Application Data

(62) Division of application No. 16/579,713, filed on Sep. 23, 2019, now Pat. No. 11,198,606.

(51) Int. Cl.
*B81B 7/00* (2006.01)
*B81B 7/02* (2006.01)
*B81C 1/00* (2006.01)

(52) U.S. Cl.
CPC ............ *B81B 7/02* (2013.01); *B81C 1/00047* (2013.01); *B81C 1/00095* (2013.01); *B81C 1/00277* (2013.01); *B81B 2201/0235* (2013.01); *B81B 2201/0242* (2013.01)

(58) Field of Classification Search
None
See application file for complete search history.

(56) References Cited

U.S. PATENT DOCUMENTS

| | | | |
|---|---|---|---|
| 9,643,838 B1 * | 5/2017 | Chu | B81C 1/00285 |
| 9,656,857 B2 | 5/2017 | Huang et al. | |
| 9,695,039 B1 | 7/2017 | Liu et al. | |
| 2014/0225206 A1 | 8/2014 | Lin et al. | |
| 2015/0129991 A1 * | 5/2015 | Lee | B81B 7/02 438/51 |

(Continued)

OTHER PUBLICATIONS

Wikipedia.org "Amorphous Silicon." Published on Sep. 1, 2019.

(Continued)

*Primary Examiner* — Ali Naraghi
(74) *Attorney, Agent, or Firm* — Eschweiler & Potashnik, LLC

(57) ABSTRACT

Various embodiments of the present disclosure are directed towards a method for manufacturing an integrated chip, the method comprises forming an interconnect structure over a semiconductor substrate. An upper dielectric layer is formed over the interconnect structure. An outgas layer is formed within the upper dielectric layer. The outgas layer comprises a first material that is amorphous. A microelectromechanical systems (MEMS) substrate is formed over the interconnect structure. The MEMS substrate comprises a moveable structure directly over the outgas layer.

20 Claims, 12 Drawing Sheets

(56) References Cited

U.S. PATENT DOCUMENTS

| | | | |
|---|---|---|---|
| 2015/0158720 A1* | 6/2015 | Lim | B81C 1/00285 |
| | | | 438/51 |
| 2016/0130137 A1 | 5/2016 | Huang et al. | |
| 2016/0332867 A1* | 11/2016 | Tseng | B81B 7/02 |
| 2017/0001861 A1 | 1/2017 | Zhang et al. | |
| 2017/0203962 A1 | 7/2017 | Cheng et al. | |
| 2017/0297907 A1 | 10/2017 | Daneman et al. | |
| 2019/0092627 A1* | 3/2019 | Lin | H01L 24/09 |
| 2021/0122625 A1* | 4/2021 | Hsieh | B81C 1/00285 |
| 2021/0309508 A1* | 10/2021 | Chang | B81B 3/001 |

OTHER PUBLICATIONS

Jennings et al. "A Study of the Effects of Annealing and Outgassing on Hydrogenated Amorphous Silicon." Thin Solid Films 310, (1997), 156-160, published Jun. 25, 1997.

Wang et al (Outgassing study of thin films used for Poly-SiGe based Vacuum pakaging of MEMs, Microelectronics Reliability 51 (2011) 1878-1881 (Year: 2011).

Non-Final Office Action dated Apr. 9, 2021 for U.S. Appl. No. 16/579,713.

Notice of Allowance dated Jul. 21, 2021 for U.S. Appl. No. 16/579,713.

* cited by examiner

STRUCTURE FOR MICROELECTROMECHANICAL SYSTEMS (MEMS) DEVICES TO CONTROL PRESSURE AT HIGH TEMPERATURE

REFERENCE TO RELATED APPLICATION

This Application is a Divisional of U.S. application Ser. No. 16/579,713, filed on Sep. 23, 2019, the contents of which are hereby incorporated by reference in their entirety.

BACKGROUND

Microelectromechanical systems (MEMS) is a technology that integrates miniaturized mechanical and electromechanical elements on an integrated chip. MEMS devices are often made using micro-fabrication techniques. In recent years, MEMS devices have found a wide range of applications. For example, MEMS devices are found in cell phones (e.g., accelerometers, gyroscopes, digital compasses), pressure sensors, micro-fluidic elements (e.g., valves, pumps), optical switches (e.g., mirrors), etc. For many applications, MEMS devices are electrically connected to application-specific integrated circuits (ASICs), and to external circuitry, to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
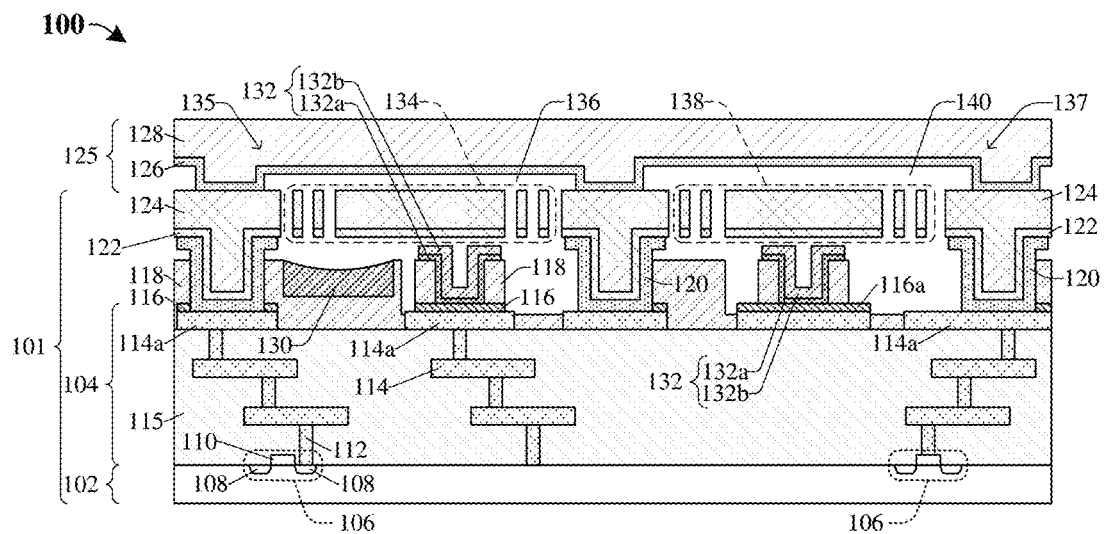
FIG. 1 illustrates a cross-sectional view of some embodiments of an integrated chip having an outgas layer and a first microelectromechanical systems (MEMS) device disposed within a first cavity, and a getter layer and a second MEMS device disposed within a second cavity.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MEMS devices may be used in a wide range of applications, for example, motion sensors are used for motion-activated user interfaces in consumer electronics such as smartphones, tablets, gaming consoles, smart-TVs, and in automotive crash detection systems. To capture a complete range of movements within a three-dimensional space, multiple MEMS devices may be integrated onto a single integrated chip. For example, motion sensors often utilize an accelerometer and a gyroscope in combination. The accelerometer detects linear movement. The gyroscope detects angular movement. To meet consumer demand for low cost, high quality, and small device footprint, the accelerometer and the gyroscope can be formed from microelectromechanical systems (MEMS) devices, which are integrated together on a same substrate. Although they share the same substrate, and hence a same manufacturing process, the accelerometer and the gyroscope utilize different operating conditions. For example, the gyroscope is often packaged in a vacuum for optimal performance. In contrast, the accelerometer is often packaged at a predetermined pressure (e.g., 1 atmosphere) to produce a smooth frequency response.

Thus, the present disclosure is directed towards an integrated circuit having two or more MEMS devices integrated together on a single substrate. According to some processes for forming the integrated circuit, an interconnect structure is formed over a semiconductor substrate. An outgas layer comprising an outgas species is formed in a first region of the interconnect structure and a getter layer is formed in a second region of the interconnect structure laterally offset from the first region. A MEMS substrate comprising one or more moveable elements for a first MEMS device and one or more moveable elements for a second MEMS device is bonded to the interconnect structure. A capping structure comprising a first cavity and a second cavity is bonded to the MEMS substrate, such that the first cavity overlies the first MEMS device and the second cavity overlies the second MEMS device. Bonding the capping structure to the MEMS substrate seals the first and second cavities. The outgas layer abuts the first cavity and the getter layer abuts the second cavity, in which the first cavity has a first gas pressure and the second cavity has a second gas pressure. The outgas layer is configured to maintain or sustain the first gas pressure and the getter layer is configured to maintain or sustain a vacuum in the second cavity, such that the first gas pressure is greater than the second gas pressure.

A challenge with the above process is related to an ability of the outgas layer to outgas the outgas species at high temperatures (e.g., above 400 degrees Celsius). For example, the outgas layer may comprise an outgas material (e.g., silicon oxide deposited by a high density plasma (HDP) chemical vapor deposition (CVD) process) configured to facilitate outgassing and maintain or sustain the first gas pressure in the first cavity during operation of the first MEMS device. The outgas material may have a low outgas activation temperature (e.g., less than 150 degrees Celsius) and may outgas a majority of the outgas species before reaching an outgas depletion temperature (e.g., approximately 400 degrees Celsius). However, bonding the MEMS substrate to the interconnect structure may comprise reaching a maximum bonding temperature (e.g., about 420 degrees Celsius) greater than or equal to the outgas depletion temperature. Thus, while bonding the MEMS substrate to the interconnect structure, a majority of the outgas species may be outgassed from the outgas layer into the fabrication chamber. Therefore, the outgas layer may be depleted of the outgas species before sealing the first cavity. This mitigates an ability of the outgas layer to maintain, sustain, and/or achieve a predetermined pressure (e.g., 1 atmosphere) in the first cavity after fabrication of the first MEMS device, thereby decreasing a quality factor, a stability, and/or an endurance of the first MEMS device.

Various embodiments of the present application are directed towards an improved outgas layer configured to continue outgassing the outgas species after fabrication of the integrated chip. The integrated chip includes an interconnect structure overlying a semiconductor substrate. A MEMS substrate comprising one or more moveable elements for a first MEMS device and one or more moveable elements for a second MEMS device overlies the interconnect structure. A capping structure comprising a first cavity and a second cavity overlies the MEMS substrate, such that the first cavity overlies the first MEMS device and the second cavity overlies the second MEMS device. An outgas layer comprising an outgas material, such as hydrogenated amorphous silicon (e.g., a-Si:H) with a high composition of an outgas species (e.g., hydrogen (H)), abuts the first cavity and a getter layer abuts the second cavity. Thus, the first cavity has a first gas pressure and the second cavity has a second gas pressure less than the first gas pressure. The outgas material has a low outgas activation temperature (e.g., about 100 degrees Celsius) and continuously outgasses the outgas species at high temperatures (e.g., greater than 570 degrees Celsius). This is because the outgas material has a high composition of the outgas species and/or the outgas material is amorphous. The random structure of the amorphous outgas material allows for continued release of the outgas species at high temperatures (e.g., greater than 420 degrees Celsius). Therefore, the outgas layer will continue outgassing the outgas species after bonding the MEMS substrate to the interconnect structure and after sealing the first cavity, such that the outgas layer may assist achieving, maintaining, and/or sustaining the first gas pressure of the first cavity during operation of the first MEMS device. This increases the quality factor, the stability, and/or the endurance of the integrated circuit.

FIG. 1 illustrates a cross-sectional view of some embodiments of an integrated chip 100 with multiple microelectromechanical systems (MEMS) devices 135, 137 disposed within cavities 136, 140, respectively.

The integrated chip 100 includes a device substrate 101 and a capping structure 125, where the device substrate 101 underlies the capping structure 125. The device substrate 101 includes a semiconductor substrate 102, an interconnect structure 104, and a MEMS substrate 124. In some embodiments, one or more active elements 106 (e.g., transistors) are disposed over and/or within the semiconductor substrate 102. In further embodiments, the one or more active elements 106 may include source/drain regions 108 disposed within the semiconductor substrate 102 and arranged below a gate 110. The interconnect structure 104 includes an interconnect dielectric structure 115, a plurality of conductive vias 112, and a plurality of conductive wires 114. The conductive vias 112 and the conductive wires 114 are disposed within the interconnect dielectric structure 115 and may be electrically coupled to the one or more active elements 106. The conductive wires 114 may include an upper conductive wire layer 114a overlying an upper surface of the interconnect dielectric structure 115 and disposed within a passivation structure 118.

The passivation structure 118 extends along the upper surface of the interconnect dielectric structure 115. An upper conductive layer 116 overlies the upper conductive wire layer 114a. A polysilicon layer 122 is disposed along a lower surface of the MEMS substrate 124. Conductive bond structures 120 are disposed along protrusions of the MEMS substrate 124 that extend through the passivation structure 118. The conductive bond structures 120 may be separated from the MEMS substrate 124 by the polysilicon layer 122. The conductive bond structures 120 may each directly contact the upper conductive wire layer 114a. The capping structure 125 overlies the MEMS substrate 124, where a first cavity 136 and a second cavity 140 are each defined between the capping structure 125 and the device substrate 101. The capping structure 125 includes a capping substrate 128 and a capping dielectric layer 126, where the capping dielectric layer 126 continuously extends along a lower surface of the capping substrate 128.

The MEMS substrate 124 includes a first MEMS device 135 and a second MEMS device 137, which are arranged in the first cavity 136 and the second cavity 140, respectively. In some embodiments, the first MEMS device 135 includes one or more first moveable elements 134 abutting the first cavity 136 and the second MEMS device 137 includes one or more second moveable elements 138 abutting the second cavity 140. The one or more first and/or second moveable elements 134, 138 may each be a part of the MEMS substrate 124. In some embodiments, the first and second cavities 136, 140 extend into the device substrate 101 and/or the capping structure 125. For instance, as shown in FIG. 1, the first and second cavities 136, 140 each extend into the passivation structure 118 to provide clearance for the one or more first and/or second moveable elements 134, 138. In other embodiments, the first and second cavities 136, 140 extend into the interconnect structure 104 and/or the semiconductor substrate 102. In some embodiments, stopper structures 132 are disposed within the first and second cavities 136, 140, where the stopper structures 132 are configured to prevent the one or more first and/or second moveable elements 134, 138 from becoming stuck to the passivation structure 118. The stopper structures 132 are disposed within the passivation structure 118 and each include a first stopper layer 132a and a second stopper layer 132b overlying the first stopper layer 132a. In some embodiments, the first stopper layer 132a is configured as an adhesion layer.

A first plurality of hermetic seal boundaries are disposed between the conductive bond structures 120 and the upper conductive wire layer 114a, and a second plurality of hermetic seal boundaries are disposed between the capping structure 125 and the MEMS substrate 124. Thus, the first cavity 136 has a first gas pressure and the second cavity 140 has a second gas pressure different than the first gas pressure. In some embodiments, the first and second plurality of hermetic seal boundaries facilitate the first and second cavities 136, 140 having the different gas pressures while being disposed laterally adjacent to one another in the device substrate 101. In some embodiments, the first gas pressure is greater than the second gas pressure.

An outgas layer 130 is disposed within the passivation structure 118 and abuts the first cavity 136, where the outgas layer 130 is configured to facilitate and/or assist the first cavity 136 having, maintaining, and/or sustaining the first gas pressure. Further, the upper conductive layer 116 includes a getter layer 116a abutting the second cavity 140, where the getter layer 116a is configured to facilitate and/or assist the second cavity 140 having, maintaining, and/or sustaining the second gas pressure. In some embodiments, the getter layer 116a may be or comprise a reactive material (e.g., titanium) configured to getter an outgas species within the second cavity 140. In some embodiments, the outgas species may, for example, be or comprise oxygen ($O_2$), argon (Ar), hydrogen ($H_2$), and/or water ($H_2O$), or the like. Thus, the getter layer 116a is configured to maintain a vacuum seal of the second cavity 140 during operation and/or formation of the integrated chip 100. In some embodiments, the outgas layer 130 comprises an outgas material (e.g., amorphous silicon (a-Si)) configured to outgas the outgas species into the first cavity 136, thereby facilitating the first cavity 136 having, maintaining, and/or sustaining the first gas pressure. Thus, the first gas pressure is greater than the second gas pressure.

In some embodiments, the outgas material may comprise a high concentration of the outgas species. For example, the outgas material may be or comprise hydrogenated amorphous silicon (e.g., a-Si:H) with a high composition of the outgas species (e.g., hydrogen (H)). In some embodiments, the outgas material may have an amorphous structure with a continuous random crystal lattice structure comprising one or more defects including, for example, dangling bonds. In such embodiments, during fabrication of the outgas layer 130, the outgas material may be formed with a reacting gas (such as $SiH_4$) comprising the outgas species, such that the outgas species may fill the defects and may, for example, bond the dangling bonds and/or reduce the dangling bond density in the outgas material. Thus, the outgas layer 130 comprises a high composition of the outgas species. Because the outgas species may bond the dangling bonds and/or reduce the dangling bond density in the outgas material, it may require high temperatures to outgas a majority of the outgas species from the outgas material. This in turn facilitates the outgas layer 130 continuously outgassing the outgas species through high temperatures (e.g., temperatures greater than 570 degrees Celsius). Thus, in some embodiments, the outgas layer 130 may facilitate the first gas pressure of the first cavity 136 being greater than the second gas pressure of the second cavity 140 during fabrication and/or operation of the integrated chip 100. In further embodiments, the first MEMS device 135 may be configured as an accelerometer and the first gas pressure may, for example, be about 1 atmosphere to produce a smooth frequency response. In such embodiments, the second MEMS device 137 may be configured as a gyroscope and the second gas pressure may, for example, be about 0 atmosphere (e.g., a vacuum) to produce smooth angular acceleration.

In some embodiments, during fabrication of the integrated chip 100, the conductive bond structures 120 are bonded to the upper conductive wire layer 114a by, for example, a eutectic bond. The eutectic bond is configured to form the first plurality of hermetic seal boundaries and may reach a maximum bonding temperature (e.g., about 435 degrees Celsius). In further embodiments, if the outgas layer 130 comprises another outgas material (e.g., silicon dioxide deposited by a high-density plasma chemical vapor deposition process) with a low outgas activation temperature (e.g., less than 150 degrees Celsius) and a low outgas depletion temperature (e.g., about 400 degrees Celsius), a majority of the outgas species may be outgassed from the another outgas material after performing the eutectic bond. In such embodiments, a majority and/or all of the outgas species is outgassed before sealing the first and/or second cavities 136, 140 such that the first cavity 136 may not achieve, sustain, and/or maintain the first gas pressure, thereby mitigating performance of the first MEMS device 135. In embodiments according to the present disclosure, the outgas layer 130 comprising the outgas material (e.g., a-Si) ensures a majority of the outgas species is not outgassed from the outgas material before sealing the first cavity 136. This, in part, is because the outgas material has a high outgas depletion temperature (e.g., greater than 570 degrees Celsius). Thus, the outgas layer 130 may continue outgassing the outgas species after performing the eutectic bond, after sealing the first cavity 136, and/or after fabricating the integrated chip 100. This in turn facilities the outgas layer 130 maintaining, achieving, and/or sustaining the first gas pressure in the first cavity 136, thereby increasing a reliability, endurance, and performance of the integrated chip 100. In some embodiments, when the first MEMS device 135 is configured as an accelerometer, by ensuring the first gas pressure is set to a predefined pressure (based on the accelerometer application) the quality factor of the first MEMS device 135 is increased.

Figure 2:
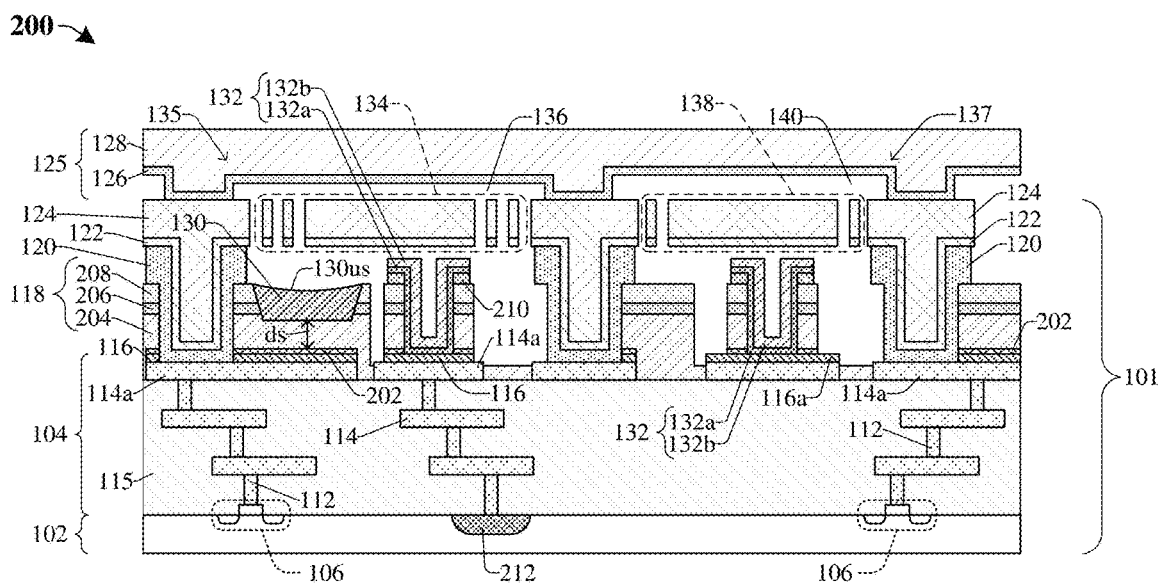
FIGS. 2-4 illustrate cross-sectional views of integrated chips according to some alternative embodiments of the integrated chip of FIG. 1.

FIG. 2 illustrates a cross-sectional view of an integrated chip 200 according to some alternative embodiments of the integrated chip 100 of FIG. 1.

The integrated chip 200 includes a capping structure 125 overlying a device substrate 101. The device substrate 101 includes a semiconductor substrate 102, an interconnect structure 104, a passivation structure 118, and a MEMS substrate 124. The semiconductor substrate 102 may, for example, be or comprise a bulk substrate (e.g., a bulk silicon substrate), crystalline silicon (c-Si), such as multi-crystalline silicon (multi-Si), or monocrystalline silicon (mono-Si), a silicon-on-insulator (SOI) substrate, or another suitable substrate material. One or more active elements 106 may be disposed on and/or within the semiconductor substrate 102. The interconnect structure 104 overlies a front-side surface of the semiconductor substrate 102 and is configured to provide electrical coupling to the one or more active elements 106 and/or doped regions within the semiconductor substrate 102.

The interconnect structure 104 includes an interconnect dielectric structure 115, a plurality of conductive wires 114, and a plurality of conductive vias 112. In some embodiments, the interconnect dielectric structure 115 may comprise one or more inter-level dielectric (ILD) layers. In further embodiments, the one or more ILD layers may, for example, be or comprise an oxide, such as silicon dioxide, a low-k dielectric material, another suitable dielectric material, or the like. The plurality of conductive vias and/or wires 112, 114 may, for example, each be or comprise aluminum, copper, aluminum copper, tungsten, titanium, a combination of the foregoing, or the like. The conductive wires 114 may include an upper conductive wire layer 114a disposed along an upper surface of the interconnect dielectric structure 115. In some embodiments, the upper conductive wire layer 114a may, for example, be or comprise aluminum, copper, a combination of the foregoing or the like and/or may have a thickness of about 8,000 Angstroms, or within a range of about 7,500 to 8,500 Angstroms. In some embodiments, a substrate pickup region 212 is disposed within the semiconductor substrate 102 and may be electrically coupled to ground by way of the interconnect structure 104.

The passivation structure 118 extends along the upper surface of the interconnect dielectric structure 115. The passivation structure 118 includes one or more passivation layers and/or structures. In some embodiments, the passivation structure 118 includes a first passivation layer 204 extending across the upper surface of the interconnect dielectric structure 115, a second passivation layer 206 overlying the first passivation layer 204, and a third passivation layer 208 overlying the second passivation layer 206. In some embodiments, the first passivation layer 204 may, for example, be or comprise an oxide, such as silicon dioxide, another suitable oxide, or the like and/or may have a thickness of about 4,000 Angstroms, 12,000 Angstroms, or within a range of about 11,500 to 12,500 Angstroms. In some embodiments, the second passivation layer may, for example, be or comprise silicon rich oxide, silicon dioxide, or another suitable dielectric material and/or may have a thickness of about 1,500 Angstroms or within a range of about 1,250 to 1,750 Angstroms. In further embodiments, the third passivation layer 208 may, for example, silicon nitride, silicon carbide, or the like and/or may have a thickness of about 4,000 Angstroms or within a range of about 3,500 to 4,500 Angstroms.

An upper conductive layer 116 may overlie the upper conductive wire layer 114a. In some embodiments, the upper conductive layer 116 may, for example, be or comprise titanium, tantalum, or the like and/or may have a thickness of about 1,800 Angstroms or within a range of about 1,600 to 2,000 Angstroms. A dielectric protection layer 202 may overlie the upper conductive layer 116. In some embodiments, the dielectric protection layer 202 may, for example, be or comprise silicon oxy-nitride, silicon nitride, or the like and/or may have a thickness of about 320 Angstroms, or within a range of about 270 to 370 Angstroms. Further, the upper conductive layer 116 may include a getter layer 116a abutting a second cavity 140, where an upper surface and sidewalls of the getter layer 116a are exposed to the second cavity 140.

A MEMS substrate 124 overlies the interconnect structure 104. A polysilicon layer 122 extends along a lower surface of the MEMS substrate 124. Conductive bond structures 120 are disposed along protrusions of the MEMS substrate 124 that extend through the passivation structure 118. In some embodiments, the MEMS substrate 124 may be or comprise a same material as the semiconductor substrate 102. For example, in some embodiments, the MEMS substrate 124 may be or comprise a bulk substrate (e.g., a bulk silicon substrate), crystalline silicon (c-Si), such as multi-crystalline silicon (multi-Si), or monocrystalline silicon (mono-Si), a silicon-on-insulator (SOI) substrate, or another suitable substrate material. The capping structure 125 overlies the MEMS substrate 124, where a first cavity 136 and the second cavity 140 are each defined between the capping structure 125 and the device substrate 101. The capping structure 125 includes a capping substrate 128 and a capping dielectric layer 126. In some embodiments, the capping substrate 128 may be or comprise the same material as the semiconductor substrate 102 and/or the MEMS substrate 124. For example, in some embodiments, the capping substrate 128 may be or comprise a bulk substrate (e.g., a bulk silicon substrate), crystalline silicon (c-Si), such as multi-crystalline silicon (multi-Si), or monocrystalline silicon (mono-Si), a silicon-on-insulator (SOI) substrate, or another suitable substrate material.

In some embodiments, the polysilicon layer 122 may, for example, be or comprise intrinsic polysilicon, doped polysilicon, or the like. Further, a lower surface and/or sidewalls of the polysilicon layer 122 abutting the first and/or second cavities 136, 140 may be rough and/or comprise a plurality of protrusions. In such embodiments, the polysilicon layer 122 is configured to prevent stiction with other structures and/or layers disposed within the first and/or second cavities 136, 140. In some embodiments, the conductive bond structures 120 may, for example, be or comprise nickel, gold, germanium, aluminum, copper, a combination of the foregoing, or the like. In further embodiments, the capping dielectric layer 126 may, for example, be or comprise an oxide, such as silicon dioxide, another suitable dielectric material, or the like.

Further, the MEMS substrate 124 includes a first MEMS device 135 and a second MEMS device 137, which are arranged in the first cavity 136 and the second cavity 140, respectively. In some embodiments, the first MEMS device 135 includes one or more first moveable elements 134 abutting the first cavity 136 and the second MEMS device 137 includes one or more second moveable elements 138 abutting the second cavity 140. The one or more first and/or second moveable elements 134, 138 may each be a part of the MEMS substrate 124. In further embodiments, stopper structures 132 are disposed within the first and second cavities 136, 140, where the stopper structures 132 are configured to prevent the one or more first and/or second moveable elements 134, 138 from becoming stuck to the passivation structure 118. The stopper structures 132 are disposed within the passivation structure 118 and each include a first stopper layer 132a and a second stopper layer 132b overlying the first stopper layer 132a. In some embodiments, the first stopper layer 132a may, for example, be or comprise titanium, a titanium rich layer, tantalum, or the like and/or may have a thickness of about 130 Angstroms or within a range of about 100 to 160 Angstroms. In further embodiments, the second stopper layer 132b may, for example, be or comprise silicon nitride, silicon carbide, or the like and/or may have a thickness of about 500 Angstroms or within a range of about 450 to 550 Angstroms. Further a dielectric capping layer 210 may be disposed between a lateral segment of the stopper structure 132 and the passivation structure 118. In some embodiments, the dielectric capping layer 210 may, for example, be or comprise silicon nitride, silicon carbide, or the like, and/or may have a thickness of about 3,500 Angstroms, or within a range of about 3,000 to 4,000 Angstroms.

An outgas layer 130 is disposed within the passivation structure 118. The outgas layer 130 has a curved, rounded, and/or concave upper surface 130us abutting the first cavity 136. Further, a lower surface of the outgas layer 130 is separated from an upper surface of an underlying dielectric protection layer 202 by a distance ds. In some embodiments, the distance ds is about 3,400 Angstroms or within a range of about 3,000 to 3,800 Angstroms. The outgas layer 130 is configured to facilitate achieving, maintaining, and/or sustaining a first gas pressure of the first cavity 136. The outgas layer 130 comprises an outgas material. In some embodiments, the outgas material may, for example, be or comprise hydrogenated amorphous silicon (e.g., a-Si:H) with a high composition of the outgas species (e.g., hydrogen (H)). In yet further embodiments, the outgas material may, for example, be or comprise amorphous silicon (e.g., a-Si). In some embodiments, the semiconductor substrate 102, the MEMS substrate 124, and/or the capping substrate 128 may be or comprise a crystalline form of the outgas material. In further embodiments, the semiconductor substrate 102, the MEMS substrate 124, and/or the capping substrate 128 may each be or comprise crystalline silicon (e.g., multi-Si or mono-Si) while the outgas layer 130 may be or comprise amorphous silicon (a-Si). Thus, the outgas layer 130 may outgas the outgas species at high temperatures (e.g., temperatures greater than 570 degrees Celsius); thereby increasing a quality factor, a performance, and/or an endurance of the integrated chip 200.

Figure 3:
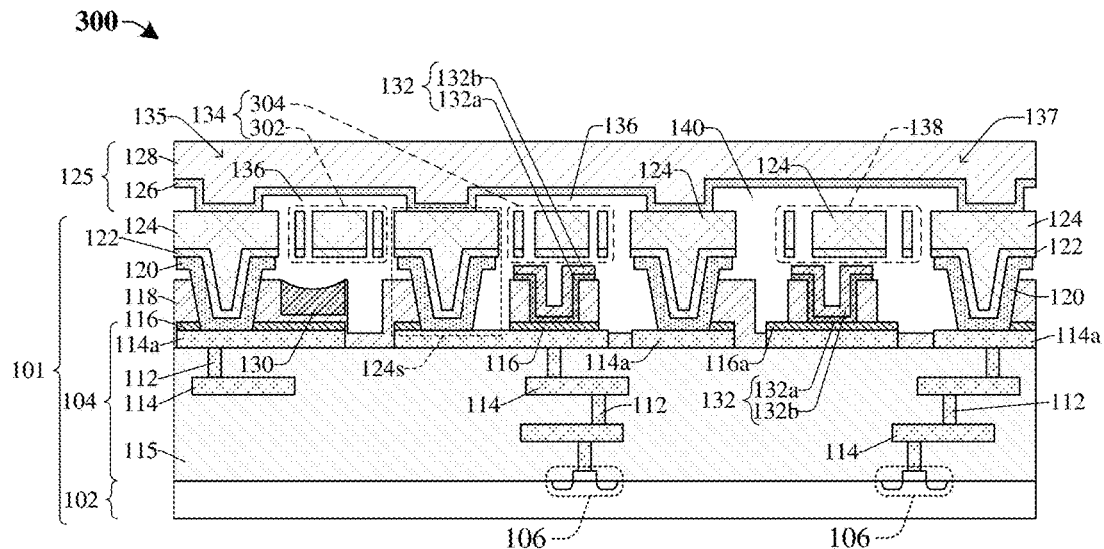

FIG. 3 illustrates a cross-sectional view of an integrated chip 300 according to some alternative embodiments of the integrated chip 200 of FIG. 2.

As illustrated in FIG. 3, the conductive bond structures 120 may each comprise slanted sidewalls extending into the passivation structure 118. Further, the one or more first moveable elements 134 may include a first group of moveable elements 302 and a second group of moveable elements 304 laterally adjacent to one another. In some embodiments, the first group of moveable elements 302 are laterally separated from the second group of moveable elements 304 by a segment 124s of the MEMS substrate 124. The first and second group of moveable elements 302, 304 are both disposed within and abut the first cavity 136. In further embodiments, the first cavity 136 continuously extends from the first group of moveable elements 302 laterally around one or more sides of the segment 124s of the MEMS substrate 124 to the second group of moveable elements 304.

Figure 4:
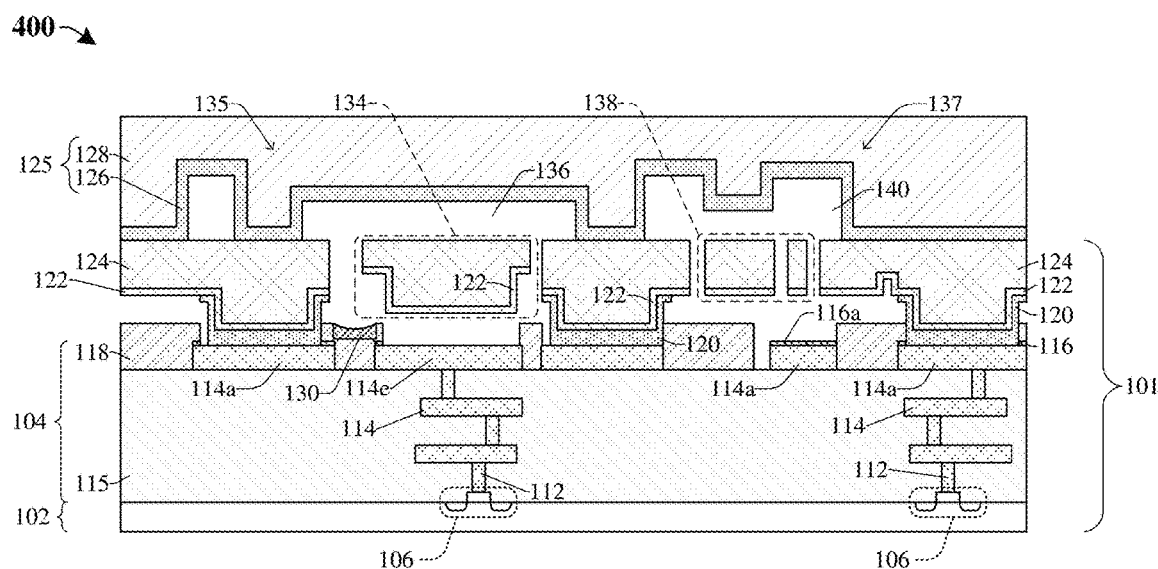

FIG. 4 illustrates a cross-sectional view of an integrated chip 400 according to some alternative embodiments of the integrated chip 200 of FIG. 2.

As illustrated in FIG. 4, the one or more first moveable elements 134 directly overlie a cavity electrode 114e disposed within the first cavity 136. In some embodiments, the cavity electrode 114e is a part of the upper conductive wire layer 114a. In some embodiments, during operation of the integrated chip 400, a change in capacitance between the cavity electrode 114e and the one or more first moveable elements 134 may be detected and converted to an electrical signal. The electrical signal may be carried to the one or more active elements 106 by way of the interconnect structure 104.

Figure 5A:
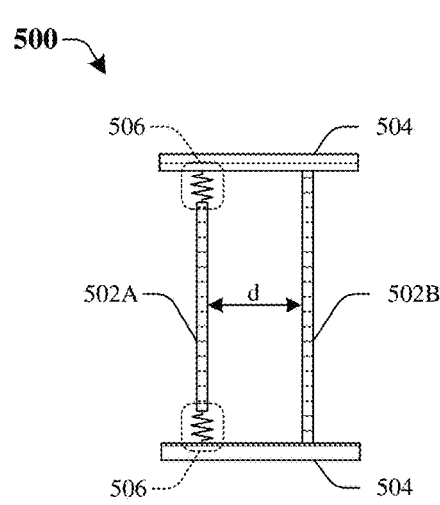
FIGS. 5A-B illustrate some embodiments of a MEMS accelerometer.
Figure 5B:
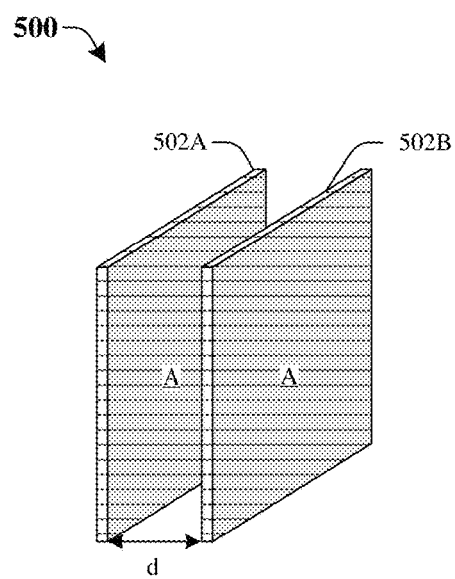

FIGS. 5A-B illustrate various views of some embodiments of a capacitive MEMS accelerometer 500. It is appreciated that the capacitive MEMS accelerometer 500 is one possible type of MEMS accelerometer that is included for illustration purposes, and does not impose any limitation on the type of MEMS accelerometer utilized in conjunction with the embodiments of the present disclosure.

The capacitive MEMS accelerometer 500 includes first and second conductive plates 502A, 502b which are oriented parallel to one another. A capacitance of the capacitive MEMS accelerometer 500 is proportional to an area (A) of the first and second conductive plates 502A, 502B, as well as a distance (d) between them. Therefore, the capacitance changes if the distance (d) between the first and second conductive plates 502A, 502B changes. The second conductive plate 502B is rigidly attached to an assembly 504. The first conductive plate 502A is elastically attached to the assembly 504 by springs 506.

When the capacitive MEMS accelerometer 500 undergoes a linear acceleration event along a direction parallel to d, the second conductive plate 502B moves with the assembly 504, while the first conductive plate 502A initially does not. Instead, the springs 506 expand, allowing the first conductive plate 502A to initially remain stationary. The resulting change in capacitance caused by the movement of the first conductive plate 502A relative to the second conductive plate 502B can be used to determine a magnitude and/or a direction of the acceleration.

Upon completion of the linear acceleration event, the first conductive plate 502A will oscillate about an equilibrium position until a damping effect of air friction slows and eventually stops it. It is therefore desirable in some embodiments to tune the damping effects of the air friction to efficiently detect a first linear acceleration event, while damping oscillation from the first linear acceleration event in enough time to detect a subsequent linear acceleration event. The damping effects of the air friction can be tuned by a gas pressure of a gas surrounding the capacitive MEMS accelerometer 500. In some embodiments, a gas pressure on an order of about 1 atmosphere can achieve effective damping. It is further appreciated that the exemplary capacitive MEMS accelerometer 500 of FIGS. 5A-B is a "1-axis" accelerometer. In order to detect a complete range of linear accelerations in a three-dimensional (3D) space, three or more orthogonally oriented capacitive MEMS accelerometers 500 can be utilized together to form a "3-axis" accelerometer.

Figure 6A:
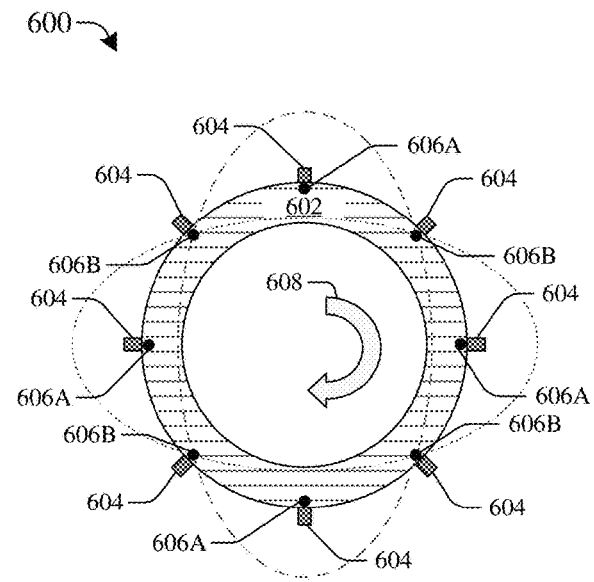
FIGS. 6A-B illustrate some embodiments of a MEMS gyroscope.
Figure 6B:
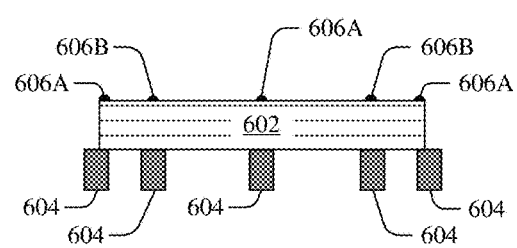

FIGS. 6A-B illustrate various views of some embodiments of a ring MEMS gyroscope 600. FIG. 6A illustrates a top view of the ring MEMS gyroscope 600. FIG. 6B illustrates a cross-sectional view of the ring MEMS gyroscope 600. It is appreciated that the ring MEMS gyroscope 600 is one possible type of MEMS gyroscope that is included for illustration purposes, and does not impose any limitation on the type of MEMS gyroscope utilized in conjunction with the embodiments of the present disclosure. The ring MEMS gyroscope 600 includes an annular ring 602. The annular ring 602 is supported in free-space by spokes 604, which are attached at first and second nodes 606A, 606B.

During operation of the ring MEMS gyroscope 600, the annular ring 602 vibrates at a resonant frequency. Actuators or transduces (not shown) are attached to the upper surface of the annular ring 602 at the first and second nodes 606A, 606B, and are electrically connected to bond pads on the spokes 604. The actuators or transducers drive the annular ring 602 into a mode of vibration at resonance. When the ring MEMS gyroscope 600 is in a resonant state, and not subjected to any angular acceleration, first nodes 606A move radially, while the second nodes 606B remain stationary. However, when the ring MEMS gyroscope 600 is subjected to an angular acceleration event (e.g., rotation 608), the Coriolis force changes the resonate state of the annular ring 602, which causes the second nodes 606B to move. By detecting the relative movement of the first and second nodes 606A, 606B, the angular acceleration of the ring MEMS gyroscope 600 can be measured.

Unlike the capacitive MEMS accelerometer 500, which oscillates during a linear acceleration event, the annular ring 602 of the ring MEMS gyroscope 600 is maintained in a resonant state while in operation. As such, the damping effects of air friction are not desired, as they require additional power from the actuators or transducers to drive the annular ring 602 into the resonant state. It is therefore desirable, in some embodiments, to negate the damping effects of the air frication to efficiently detect an angular acceleration event by sealing the ring MEMS gyroscope 600 in a vacuum. The vacuum my increase a performance of the ring MEMS gyroscope 600 by suppressing energy dissipation due to air friction.

FIGS. 7-22 illustrate cross-sectional views 700-2200 of some embodiments of a method of forming an integrated chip having an outgas layer and a first microelectromechanical systems (MEMS) device disposed within a first cavity, and a getter layer and a second MEMS device disposed within a second cavity according to the present disclosure. Although the cross-sectional views 700-2200 shown in FIGS. 7-22 are described with reference to a method, it will be appreciated that the structures shown in FIGS. 7-22 are not limited to the method but rather may stand alone separate of the method. Furthermore, although FIGS. 7-22 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
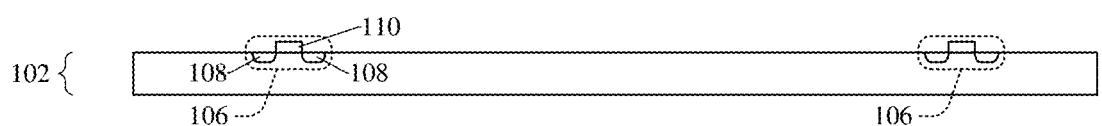
FIGS. 7-22 illustrate cross-sectional views of some embodiments of a method of forming an integrated chip having an outgas layer and a first MEMS device disposed within a first cavity, and a getter layer and a second MEMS device disposed within a second cavity.

As illustrated by the cross-sectional view 700 of FIG. 7, a semiconductor substrate 102 is provided and one or more active elements 106 are formed over/within the semiconductor substrate 102. In some embodiments, the one or more active elements 106 may be or comprise transistors. In such embodiments, source/drain regions 108 of the one or more active elements 106 may be formed by performing a selective ion implantation process on the semiconductor substrate 102, thereby implanting dopants into the semiconductor substrate 102. Further, a gate 110 of the one or more active elements 106 may be deposited by chemical vapor deposition (CVD), physical vapor deposition (PVD), sputtering, or another suitable growth or deposition process, and subsequently performing a patterning process according to a masking layer (not shown), thereby defining the gate 110.

Figure 8:
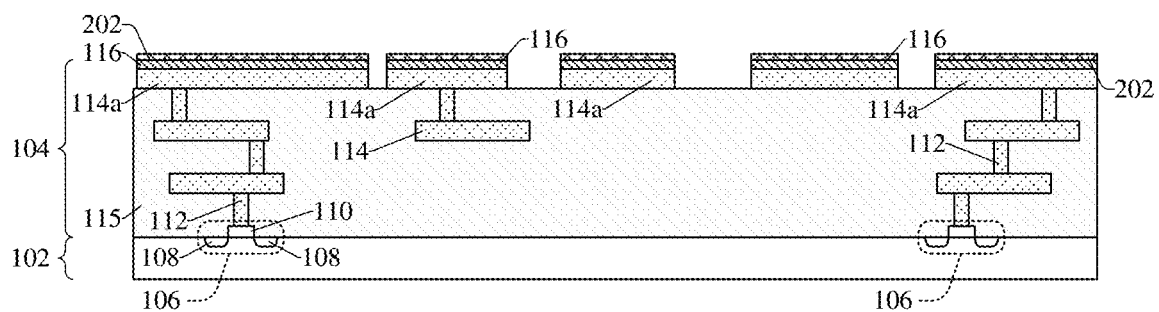

As illustrated by the cross-sectional view 800 of FIG. 8, an interconnect structure 104 is formed over the semiconductor substrate 102. The interconnect structure 104 includes an interconnect dielectric structure 115, a plurality of conductive wires 114, and a plurality of conductive vias 112. In some embodiments, a process for forming the conductive vias and/or wires 112, 114 may, for example, include performing a single damascene process and/or a dual damascene process one or more times. In further embodiments, the conductive wires 114 include an upper conductive wire layer 114a. An upper conductive layer 116 is formed over the upper conductive wire layer 114a, and a dielectric protection layer 202 is formed over the upper conductive layer 116. In some embodiments, a process for forming the upper conductive wire layer 114a, the upper conductive layer 116, and the dielectric protection layer 202 may include: depositing (e.g., CVD, PVD, atomic layer deposition (ALD), sputtering, electroless plating, etc.) a stack of layers over an upper surface of the interconnect dielectric structure 115; forming a masking layer (not shown) over the stack of layers; exposing unmasked regions of the stack of layers to one or more etchants, thereby defining the upper conductive wire layer 114a, the upper conductive layer 116, and the dielectric protection layer 202; and performing a removal process to remove the masking layer. In some embodiments, the upper conductive wire layer 114a may, for example, be or comprise copper, aluminum, tungsten, a combination of the foregoing, or the like and/or may be formed to a thickness of about 8,000 Angstroms. In some embodiments, the upper conductive layer 116 may, for example, be or comprise titanium, tantalum, or the like and/or may be formed to a thickness of about 1,800 Angstroms. In some embodiments, the dielectric protection layer 202 may, for example, be or comprise silicon oxynitride, silicon nitride, or the like and/or may be formed to a thickness of about 320 Angstroms.

Figure 9:
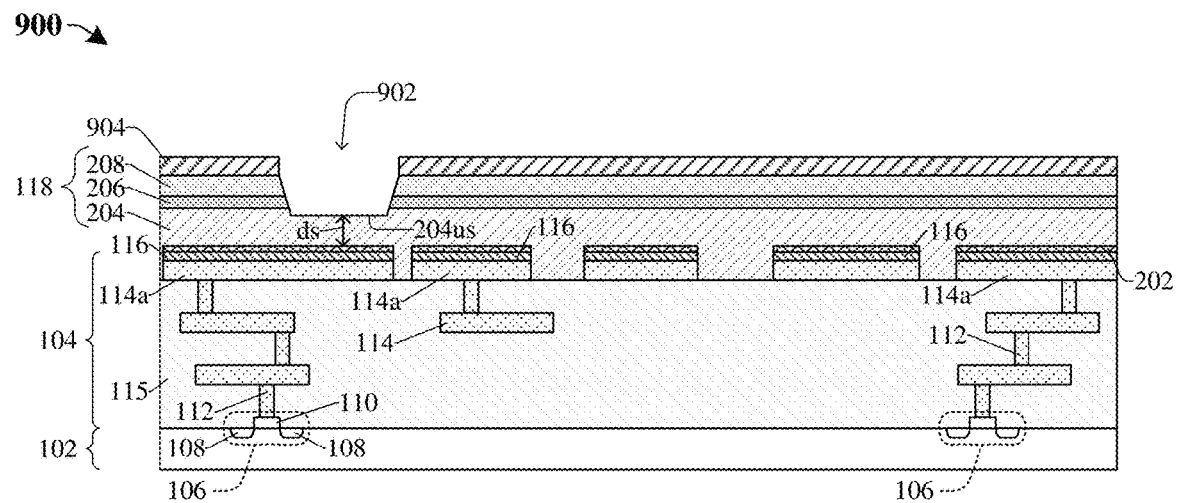

As illustrated by the cross-sectional view 900 of FIG. 9, a passivation structure 118 is formed over the interconnect structure 104. In some embodiments, a process for forming the passivation structure 118 may include forming one or more layers by, for example, CVD, PVD, atomic layer deposition (ALD), or another suitable deposition process. In further embodiments, the passivation structure 118 may include a first passivation layer 204, a second passivation layer 206, and a third passivation layer 208. In some embodiments, the first passivation layer 204 may, for example, be deposited by plasma-enhanced CVD. In such embodiments, the first passivation layer 204 may, for example, be or comprise an oxide, such as silicon dioxide, another suitable oxide, or the like and/or may be formed to a thickness of about 4,000 Angstroms, 12,000 Angstroms, or another suitable thickness. Thus, the first passivation layer 204 may be configured as another outgas layer comprising another outgas material with a low outgas depletion temperature (e.g., about 420 degrees Celsius). In further embodiments, the first passivation layer 204 may, for example, be or comprise silicon dioxide and/or may be deposited by high density plasma CVD. In some embodiments, the second passivation layer 206 may, for example, be or comprise silicon rich oxide, or another suitable dielectric material and/or may be formed to a thickness of about 1,500 Angstroms. In further embodiments, the third passivation layer 208 may, for example, be or comprise silicon nitride, silicon carbide, or the like and/or may be formed to a thickness of about 4,000 Angstroms.

Also as illustrated in the cross-sectional view 900 of FIG. 9, the passivation structure 118 is patterned according to a masking layer 904 to define an outgas layer opening 902. In some embodiments, the patterning process may include performing a wet etch and/or a dry etch. An upper surface 204us of the first passivation layer 204 defines a bottom of the outgas layer opening 902. In some embodiments, the upper surface 204us of the first passivation layer 204 is separated from an upper surface of the dielectric protection layer 202 by a distance ds. In further embodiments, the distance ds is about 3,400 Angstroms, or within a range of about 3,200 to 3,600 Angstroms. In further embodiments, after forming the outgas layer opening 902, a removal process is performed to remove the masking layer 904 (not shown).

Figure 10:
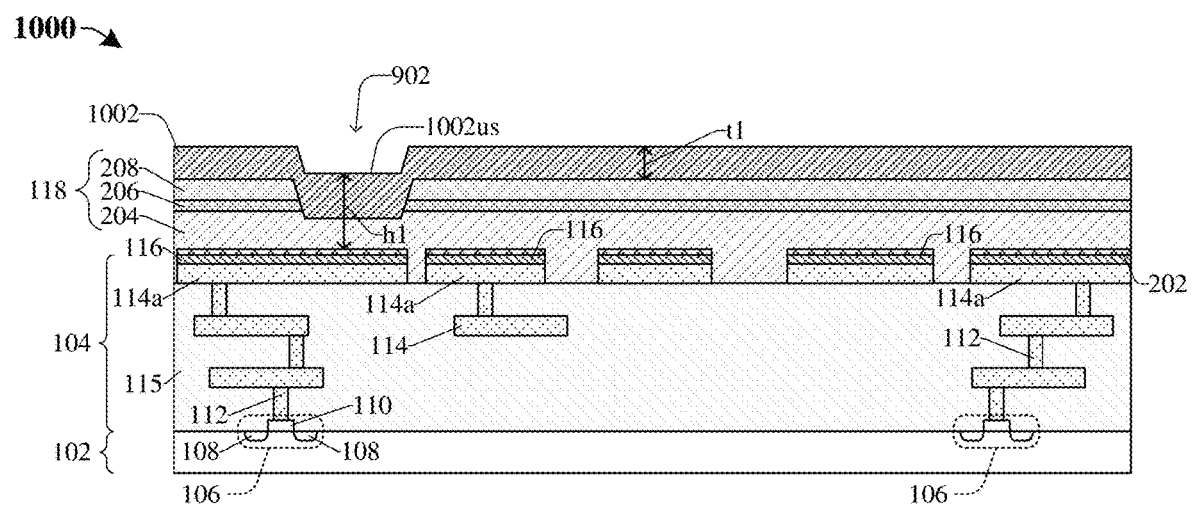

As illustrated by the cross-sectional view 1000 of FIG. 10, an outgas structure 1002 comprising an outgas material (e.g., amorphous silicon (a-Si)) is formed over the passivation structure 118, thereby filling the outgas layer opening 902. In some embodiments, the outgas structure 1002 is deposited by a suitable deposition process, such as CVD, PVD, ALD, plasma-enhanced CVD (PECVD), high density plasma (HDP) CVD, sputtering, or another suitable growth or deposition process. In some embodiments, the outgas material is formed by the suitable deposition process utilizing a first gas (e.g., $SiH_x$, where x is a positive whole number) as a precursor gas and/or a reacting gas. In some embodiments, the first gas may be or comprise silane ($SiH_4$). Thus, in some embodiments, the outgas material may, for example, be or comprise amorphous silicon (a-Si), hydrogenated amorphous silicon (e.g., a-Si:H), or the like. For example, the first gas may be silane ($SiH_4$) and the deposition process may include reaching a maximum deposition temperature (e.g., less than 500 degrees Celsius). The maximum deposition temperature and the first gas facilitates the outgas structure 1002 comprising amorphous silicon and a high concentration of the outgas species (e.g., hydrogen (H)). In some embodiments, the outgas species may fill and/or correct defects (e.g., dangling bonds) present in the outgas material, thereby reducing the dangling bond density in the outgas material. In some embodiments, a height h1 between an upper surface 1002us of the outgas structure 1002 and the dielectric protection layer 202 is about 14,000 Angstroms or within a range of about 12,000 to 16,000 Angstroms. In further embodiments, a thickness t1 of the outgas structure 1002 laterally offset the outgas layer opening 902 and overlying an upper surface of the third passivation layer 208 is about 10,500 Angstroms or within a range of about 8,500 to 12,500 Angstroms. In further embodiments, the outgas structure 1002 may be deposited with a deposition temperature of about 200 degrees Celsius, about 400 degrees Celsius, or another suitable temperature. In some embodiments, depositing the outgas structure 1002 with a deposition temperature of about 200 degrees Celsius may increase $SiH_2$ present in the outgas material after the deposition process. This in turn may increase an ability of the outgas material to outgas the outgas species.

Figure 11:
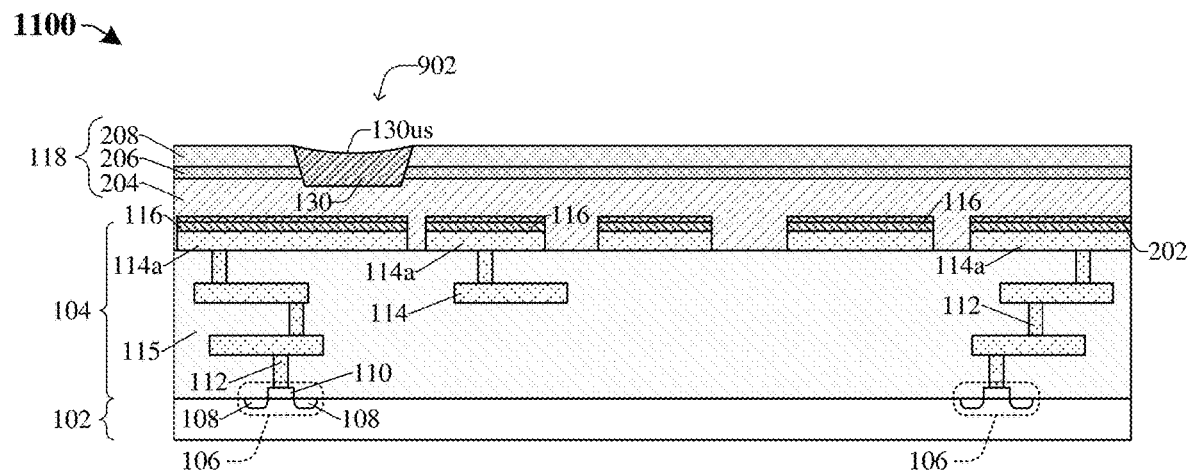

As illustrated by the cross-sectional view 1100 of FIG. 11, a planarization process (e.g., a chemical mechanical planarization (CMP) process) is performed on the outgas structure (1002 of FIG. 10) until the upper surface of the passivation structure 118 is reached, thereby defining an outgas layer 130. In some embodiments, due to dishing and/or over-polishing during the planarization process the outgas layer 130 has a curved or concaved upper surface 130us, such that the upper surface 130us is disposed below the upper surface of the passivation structure 118. In further embodiments, the outgas structure (1002 of FIG. 10) is removed from the upper surface of the passivation structure 118 in regions laterally offset from the outgas layer opening 902.

Figure 20:
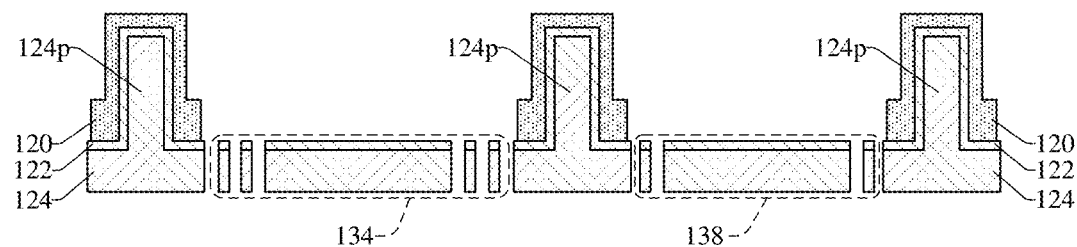

In some embodiments, the outgas layer 130 has an outgas depletion temperature (e.g., about 575 degrees Celsius or greater) greater than a maximum temperature used during subsequent processing steps (e.g., the bonding process of FIG. 20). In some embodiments, due to the deposition process of the outgas layer 130 and the amorphous structure of the outgas material, the outgas material may comprise a-Si, $SiH_3$, $SiH_2$, and/or SiH. While the outgas material is exposed to different temperatures, it may have different outgas temperature ranges. For example, in a first outgas temperature range (e.g., about 350 to 450 degrees Celsius) the outgas material may break $SiH_3$ into $SiH_2$ and SiH and/or into $SiH_2$ and H, thereby outgassing the outgas species. Further, in a second outgas temperature range (e.g., about 450 to 575 degrees Celsius), the outgas material may break $SiH_2$ into Si and SiH and/or into SiH and H, thereby outgassing the outgas species. Furthermore, in a third outgas temperature range (e.g. about 575 to 725 degrees Celsius), the outgas material may break SiH into Si and H, thereby outgassing the outgas species. Thus, the outgas layer 130 may outgas the outgas species across a wide range of temperatures and may continue outgassing at high operating and/or fabrication temperatures.

Figure 12:
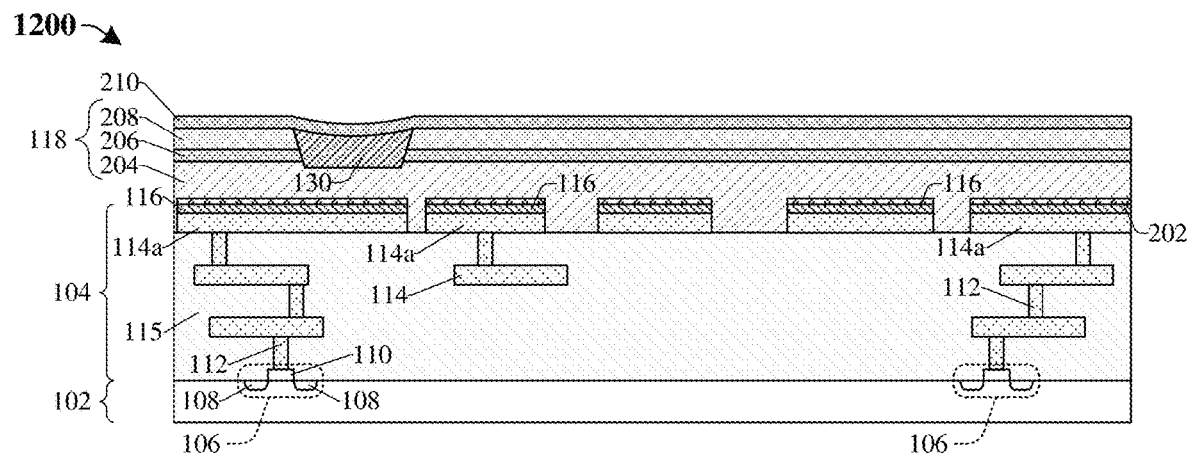

As illustrated by the cross-sectional view 1200 of FIG. 12, a dielectric capping layer 210 is formed over the passivation structure 118 and the outgas layer 130. In some embodiments, the dielectric capping layer 210 may, for example, be or comprise silicon nitride, silicon carbide, or the like and/or may have a thickness of about 3,500 Angstroms or within a range of about 3,000 to 4,000 Angstroms. In some embodiments, the dielectric capping layer 210 may include a capping layer overlying a dielectric layer, the capping layer may have a thickness of about 500 Angstroms and the dielectric layer may have a thickness of about 3,000 Angstroms. In such embodiments, the capping layer and the dielectric layer comprise a same material (e.g., silicon nitride).

Figure 13:
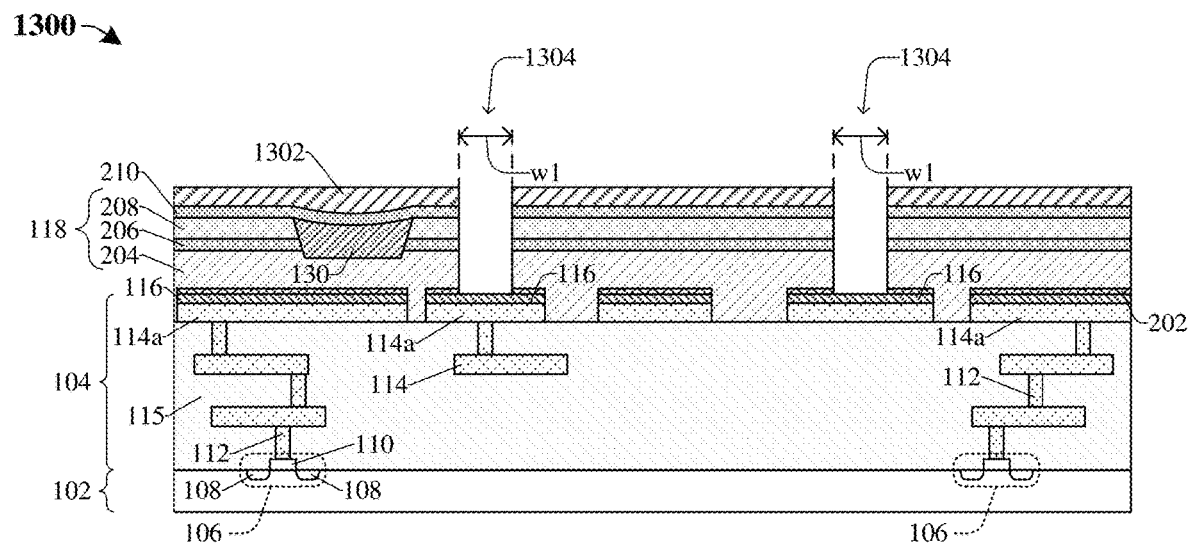

As illustrated by the cross-sectional view 1300 of FIG. 13, a masking layer 1302 is formed over the dielectric capping layer 210, where the masking layer 1302 has sidewalls defining one or more openings. In some embodiments, a patterning process is performed on the passivation structure 118 and the dielectric capping layer 210 according to the masking layer 1302, thereby defining one or more stopper structure openings 1304. In some embodiments, the patterning process exposes an upper surface of the upper conductive layer 116. In further embodiments, the one or more stopper structure openings 1304 may, for example, each have a width w1 of about 2 micrometers or within a range of about 1.9 to 2.1 micrometers. In yet further embodiments, if when viewed from above the one or more stopper structure openings 1304 are circular then the width w1 may correspond to a diameter of the one or more stopper structure openings 1304. In yet further embodiments, after the patterning process, a removal process is performed to remove the masking layer 1302 (not shown).

Figure 14:
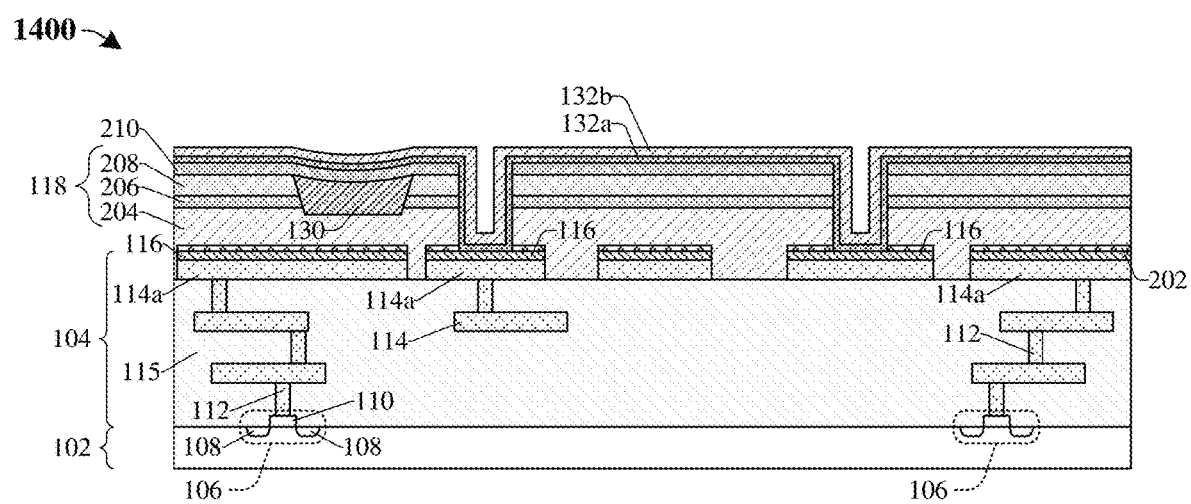

As illustrated by the cross-sectional view 1400 of FIG. 14, a first stopper layer 132a is formed over the dielectric capping layer 210 and the upper conductive layer 116, further a second stopper layer 132b is formed over the first stopper layer 132a. In some embodiments, the first and second stopper layers 132a-b each at least partially fill the one or more stopper structure openings (1304 of FIG. 13). In some embodiments, the first stopper layer 132a may, for example, be or comprise titanium, a titanium rich material, tantalum, or the like and/or may be formed to a thickness of about 130 Angstroms or within a range of about 110 to 150 Angstroms. In some embodiments, the second stopper layer 132b may, for example, be or comprise a nitride, such as titanium nitride, tantalum nitride, or the like and/or may be formed to a thickness of about 500 Angstroms or within a range of about 450 to 550 Angstroms.

Figure 15:
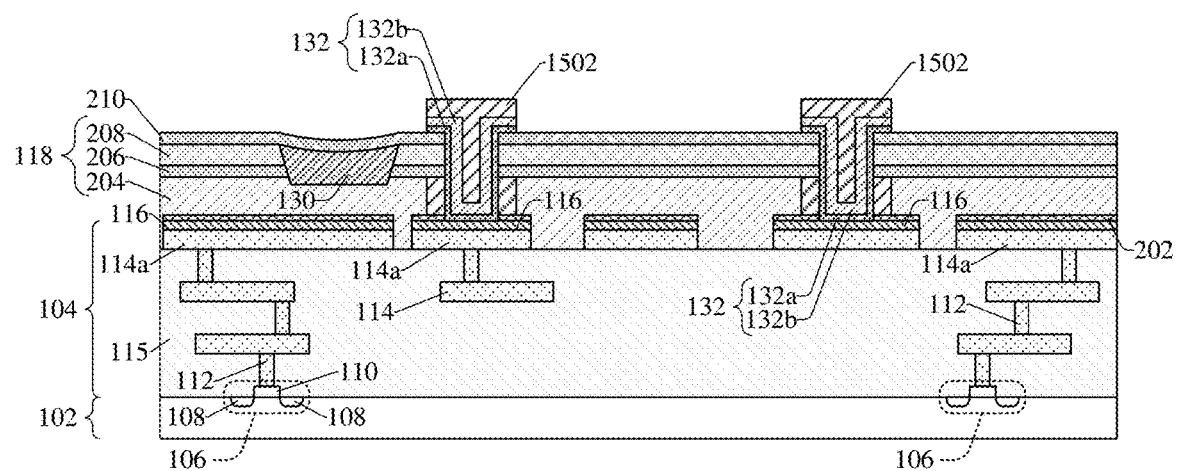

As illustrated by the cross-sectional view 1500 of FIG. 15, a masking layer 1502 is formed over the second stopper layer 132b. The first and second stopper layers 132a, 132b are patterned according to the masking layer 1502, thereby defining stopper structures 132 overlying the upper conductive wire layer 114a. In some embodiments, after the patterning process, a removal process is performed to remove the masking layer 1502 (not shown).

Figure 16:
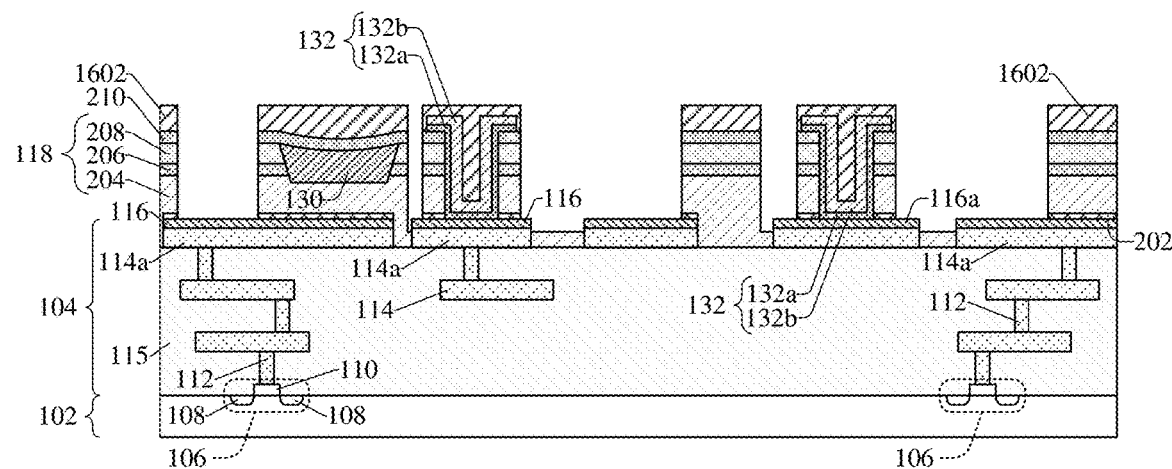

As illustrated by the cross-sectional view 1600 of FIG. 16, a masking layer 1602 is formed over the dielectric capping layer 210 and the stopper structures 132. Further, the passivation structure 118, the dielectric capping layer 210, and the dielectric protection layer 202 are patterned according to the masking layer 1602, thereby defining one or more openings. In some embodiments, the patterning process may expose an upper surface of the upper conductive layer 116 and define a getter layer 116a disposed between a stopper structure 132 and the upper conductive wire layer 114a. In further embodiments, after the patterning process, a removal process is performed to remove the masking layer 1602 (not shown).

Figure 17:
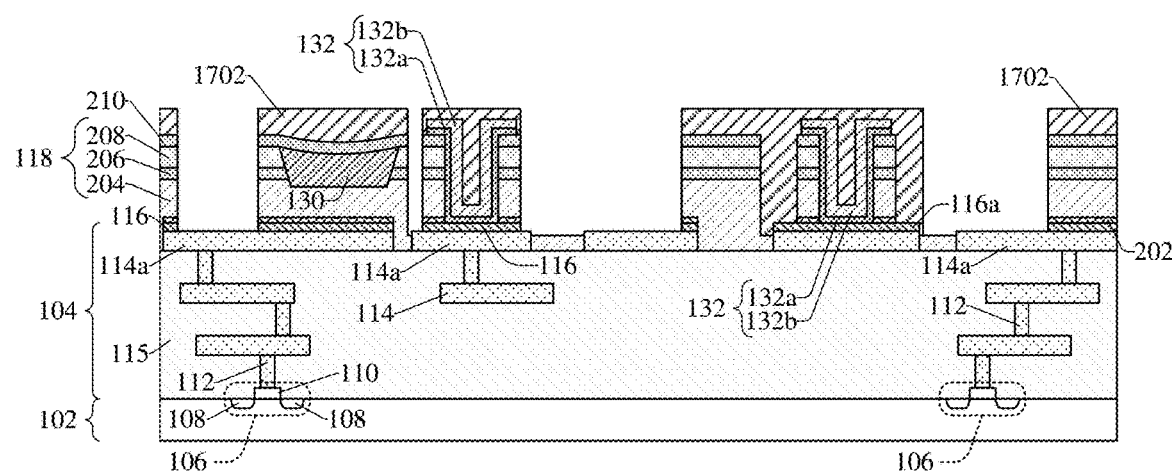

As illustrated by the cross-sectional view 1700 of FIG. 17, a masking layer 1702 is formed over the dielectric capping layer 210 and the stopper structures 132. Further, the passivation structure 118, the dielectric capping layer 210, the dielectric protection layer 202, and the upper conductive layer 116 are patterned according to the masking layer 1702. In some embodiments, the patterning process may include performing a dry etch process, a wet etch process, or another suitable etch process. The masking layer 1702 is configured to protect the getter layer 116*a* during the patterning process of FIG. 17. Further, the patterning process of FIG. 17 exposes an upper surface and/or sidewalls of the upper conductive wire layer 114*a*. In yet further embodiments, after performing the patterning process, a removal process may be performed to remove the masking layer 1702.

Figure 18:
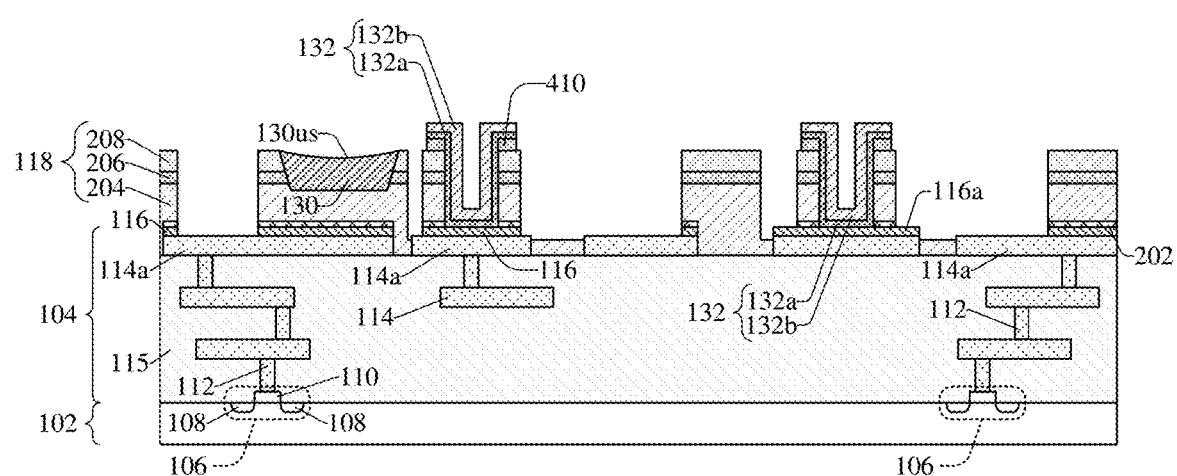

As illustrated by the cross-sectional view 1800 of FIG. 18, an etch process is performed on the dielectric capping layer 210, thereby exposing the upper surface 130*us* of the outgas layer 130 and exposing an upper surface of the passivation structure 118. In some embodiments, the etch process may be a wet etch, a dry etch, a blanket etch, a combination of the foregoing, or some other suitable etch process.

Figure 19:
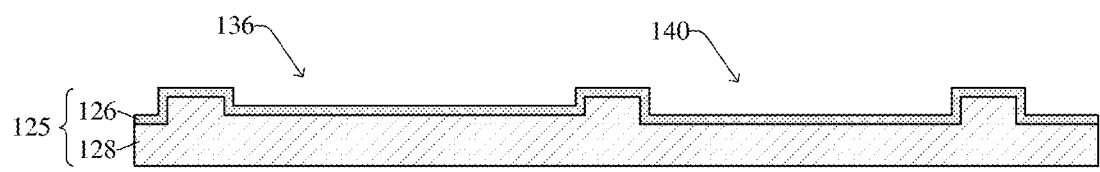

As illustrated by the cross-sectional view 1900 of FIG. 19, a capping substrate 128 is provided and is subsequently etched to define a first cavity 136 and a second cavity 140. Further, a capping dielectric layer 126 is formed over the upper surface of the capping substrate 128, thereby defining a capping structure 125.

As illustrated by the cross-sectional view 2000 of FIG. 20, a MEMS substrate 124 is provided and is subsequently patterned to define one or more protrusions 124*p*. A polysilicon layer 122 is formed over the MEMS substrate 124. Conductive bond structures 120 are formed over the polysilicon layer 122 and continuously extend along the one or more protrusions 124*p*. Further, an etch process is performed on the MEMS substrate 124 to define one or more first moveable elements 134 and one or more second moveable elements 138.

Figure 21:
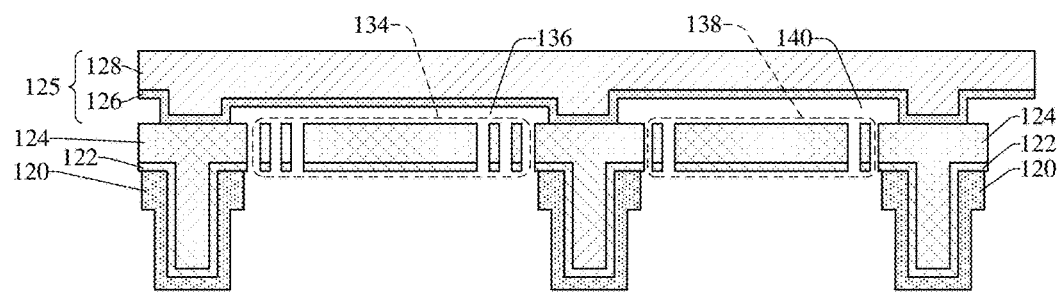

As illustrated by the cross-sectional view 2100 of FIG. 21, the capping structure 125 is flipped, the MEMS substrate 124 is flipped, and the capping structure 125 is subsequently bonded to the MEMS substrate 124. In some embodiments, bonding the capping structure 125 to the MEMS substrate 124 includes performing a fusion bond process. In some embodiments, a maximum temperature of the fusion bond process may be within a range of about 150 to 300 degrees Celsius. Thus, the maximum temperature of the fusion bond process is less than the outgas depletion temperature of the outgas layer 130, such that the outgas layer 130 may outgas the outgas species after bonding the capping structure 125 to the MEMS substrate 124.

Figure 22:
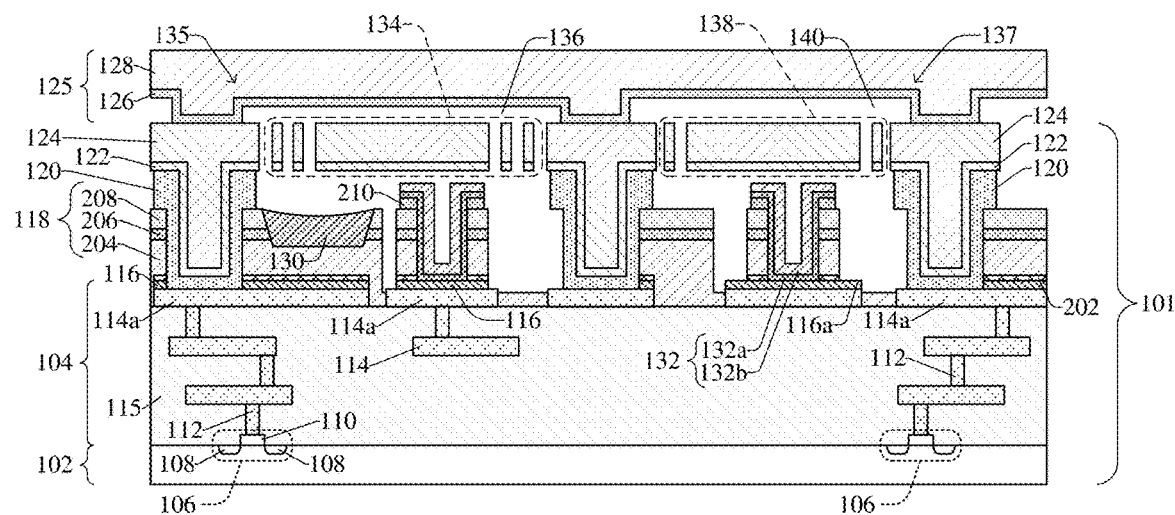

As illustrated by the cross-sectional view 2200 of FIG. 22, the MEMS substrate 124 is bonded to the interconnect structure 104, thereby defining a device substrate 101, sealing the first and second cavities 136, 140, and defining a first MEMS device 135 and a second MEMS device 137. In some embodiments, bonding the interconnect structure 104 to the MEMS substrate 124 includes performing a eutectic bond process and reaching a maximum bonding temperature (e.g., about 423 degrees Celsius or higher) during the eutectic bond process. The maximum bonding temperature is less than the outgas depletion temperature of the outgas layer 130, thus the outgas layer 130 may outgas the outgas species after performing the eutectic bond process and sealing the first and second cavities 136, 140. Further, a bonding force may be applied to an upper surface of the MEMS substrate 124 during the eutectic bond process. In some embodiments, the bonding force may be within a range of about 30 to 40 kilonewtons (kN). In some embodiments, a first bonding pressure (e.g., about 1 atmosphere) surrounds the one or more first and second moveable elements 134, 138 during the eutectic bond process.

In some embodiments, the eutectic bond process seals the first cavity 136 and the second cavity 140 between the capping structure 125 and the device substrate 101, thereby defining the first MEMS device 135 and the second MEMS device 137. In some embodiments, the first cavity 136 is sealed with a first gas pressure and the second cavity is sealed with a second gas pressure that is less than the first gas pressure. In further embodiments, the maximum temperature of the eutectic bond process is less than the outgas depletion temperature of the outgas layer 130, such that the outgas layer 130 may outgas the outgas species after sealing the first and second cavities 136, 140. In some embodiments, before and/or during the eutectic bond process, the first and second cavities 136, 140 have an initial gas pressure of about 1 atmosphere. In such embodiments, after the eutectic bond process, the first gas pressure of the first cavity 136 is about 1 atmosphere and the second gas pressure of the second cavity 140 is about 0 atmosphere.

Figure 23:
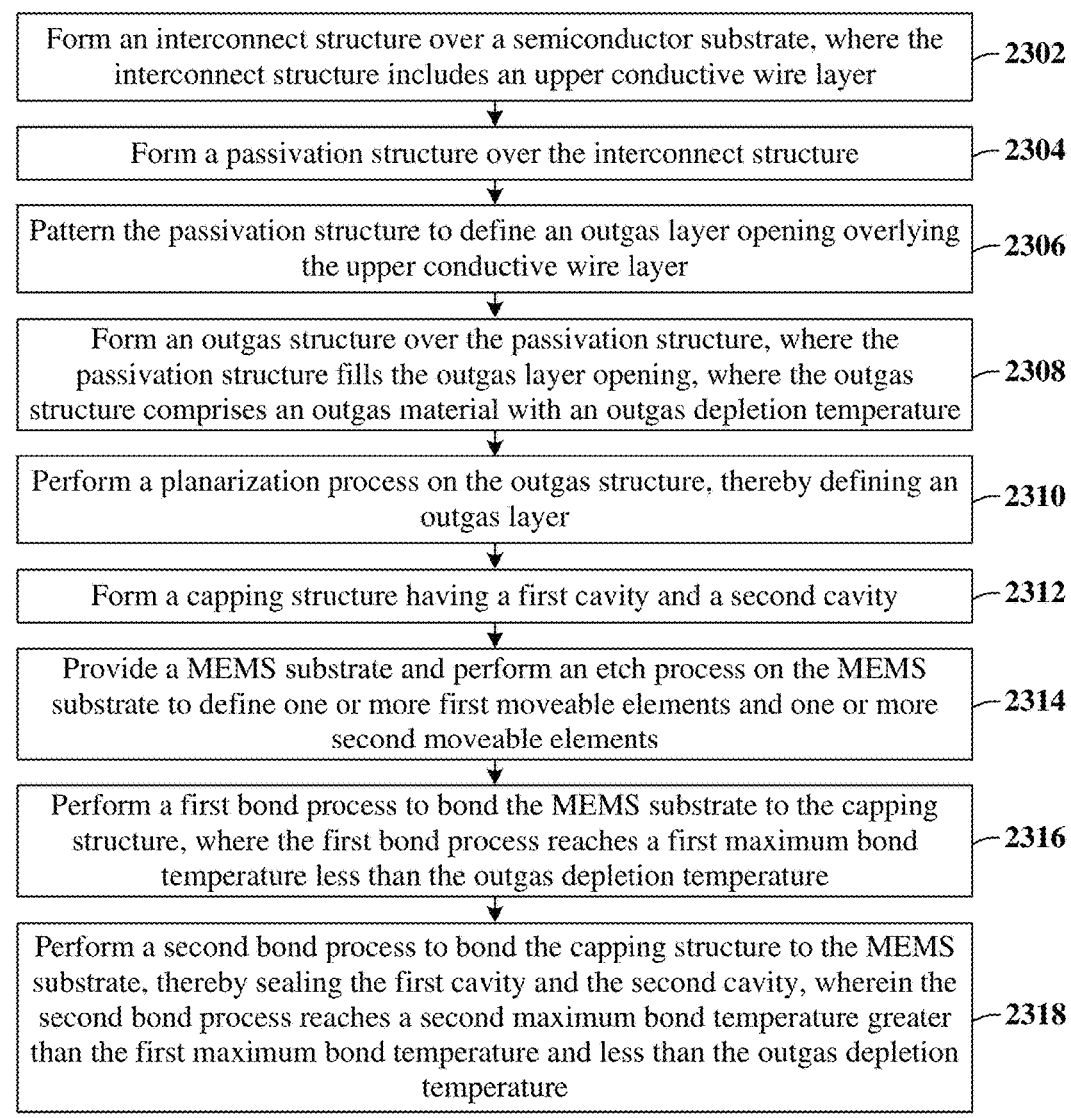
FIG. 23 illustrates a methodology of some embodiments of forming an integrated chip having an outgas layer and a first MEMS device disposed within a first cavity, and a getter layer and a second MEMS device disposed within a second cavity.

FIG. 23 illustrates a method 2300 of forming an integrated chip having an outgas layer and a first MEMS device disposed within a first cavity, and a getter layer and a second MEMS device disposed within a second cavity according to the present disclosure. Although the method 2300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2302, an interconnect structure is formed over a semiconductor substrate. The interconnect structure includes an upper conductive wire layer. FIG. 8 illustrates a cross-sectional view 800 corresponding to some embodiments of act 2302.

At act 2304, a passivation structure is formed over the interconnect structure. FIG. 9 illustrates a cross-sectional view 900 corresponding to some embodiments of act 2304.

At act 2306, the passivation structure is patterned to define an outgas layer opening overlying the upper conductive wire layer. FIG. 9 illustrates a cross-sectional view 900 corresponding to some embodiments of act 2306.

At act 2308, an outgas structure is formed over the passivation structure. The passivation structure fills the outgas layer opening and comprises an outgas material with an outgas depletion temperature. FIG. 10 illustrates a cross-sectional view 1000 corresponding to some embodiments of act 2308.

At act 2310, a planarization process is performed on the outgas structure, thereby defining an outgas layer. FIG. 11 illustrates a cross-sectional view 1100 corresponding to some embodiments of act 2310.

At act 2312, a capping structure is formed having a first cavity and a second cavity. FIG. 19 illustrates a cross-sectional view 1900 corresponding to some embodiments of act 2312.

At act 2314, a MEMS substrate is provided and subsequently an etch process is performed on the MEMS substrate to define one or more first moveable elements and one or more second moveable elements. FIG. 20 illustrates a cross-sectional view 2000 corresponding to some embodiments of act 2314.

At act 2316, a first bond process is performed to bond the MEMS substrate to the capping structure. The first bond process reaches a first maximum bond temperature less than the outgas depletion temperature. FIG. 21 illustrates a cross-sectional view 2100 corresponding to some embodiments of act 2316.

At act 2318, a second bond process is performed to bond the MEMS substrate to the interconnect structure, thereby sealing the first and second cavities. The second bond process reaches a second maximum bond temperature greater than the first maximum bond temperature and less than the outgas depletion temperature. FIG. 22 illustrates a cross-sectional view 2200 corresponding to some embodiments of act 2318.

Accordingly, in some embodiments, the present disclosure relates to an integrated chip having a first MEMS device disposed within a first cavity and a second MEMS device disposed within a second cavity. An outgas layer abuts the first cavity, such that the first cavity has a first gas pressure, and a getter layer abuts the second cavity, such that the second cavity has a second gas pressure different than the first gas pressure.

In some embodiments, the present application provides an integrated chip including a device substrate having a first MEMS device and a second MEMS device laterally offset from the first MEMS device; a capping structure overlying the device substrate, wherein the capping structure includes a first cavity overlying the first MEMS device and a second cavity overlying the second MEMS device, wherein the first cavity has a first gas pressure, and wherein the second cavity has a second gas pressure different from the first cavity; and an outgas layer abutting the first cavity, wherein the outgas layer includes an outgas material having an outgas species, and wherein the outgas material is amorphous.

In some embodiments, the present application provides an integrated chip including a semiconductor substrate including a first material; an interconnect structure overlying the semiconductor substrate; a passivation structure overlying the interconnect structure; a microelectromechanical systems (MEMS) substrate overlying the interconnect structure, wherein the MEMS substrate includes a first moveable structure and a second moveable structure laterally offset from the first moveable structure; a capping substrate overlying the MEMS substrate, wherein the capping substrate includes a first cavity overlying the first moveable structure and a second cavity overlying the second moveable structure, wherein the first cavity has a first gas pressure and the second cavity has a second gas pressure, and wherein the capping substrate includes the first material; a getter layer disposed within the second cavity, wherein the getter layer is configured to getter an outgas species from the second cavity; and an outgas layer disposed within the passivation structure and abutting the first cavity, wherein the outgas layer is configured to release the outgas species into the first cavity, such that the first gas pressure is greater than the second gas pressure, wherein the outgas layer includes a second material, and wherein the second material is an amorphous form of the first material.

In some embodiments, the present application provides a method for manufacturing an integrated chip, the method includes forming an interconnect structure over a semiconductor substrate; forming a passivation structure over the interconnect structure; forming an outgas layer in the passivation structure, wherein the outgas layer includes an outgas material with an outgas depletion temperature; forming a capping structure comprising a first cavity and a second cavity; forming a microelectromechanical systems (MEMS) substrate including a first moveable structure and a second moveable structure; performing a first bonding process to bond the MEMS substrate to the capping structure, wherein the first bonding process reaches a first maximum bonding temperature less than the outgas depletion temperature; and performing a second bonding process to bond the MEMS substrate to the interconnect structure, wherein the first cavity overlies the first moveable structure and the second cavity overlies the second moveable structure, wherein the second bonding process reaches a second maximum bonding temperature less than the outgas depletion temperature, and wherein the second bonding process seals the first cavity with a first gas pressure and seals the second cavity with a second gas pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated chip, the method comprising:
    forming an interconnect structure over a semiconductor substrate;
    forming an upper dielectric layer over the interconnect structure;
    forming an outgas layer within the upper dielectric layer, wherein the outgas layer comprises a first material that is amorphous; and
    forming a microelectromechanical systems (MEMS) substrate over the interconnect structure, wherein the MEMS substrate comprises a moveable structure directly over the outgas layer.

2. The method of claim 1, wherein the semiconductor substrate comprises a crystalline form of the first material.

3. The method of claim 1, wherein the outgas layer is configured to outgas an outgas species in the first material and has an outgas depletion temperature.

4. The method of claim 3, wherein the outgas depletion temperature is greater than 420 degrees Celsius.

5. The method of claim 3, wherein forming the MEMS substrate comprises performing a first bonding process to bond the MEMS substrate to the interconnect structure, wherein a first maximum temperature of the first bonding process is less than the outgas depletion temperature.

6. The method of claim 5, further comprising:
    performing a second bonding process to bond a capping structure to the MEMS substrate, wherein a second maximum temperature of the second bonding process is less than the outgas depletion temperature.

7. The method of claim 6, wherein the second maximum temperature is less than the first maximum temperature.

8. The method of claim 6, wherein the first bonding process comprises a eutectic bonding process and the second bonding process comprises a fusion bonding process.

9. The method of claim 1, wherein the outgas layer has a curved upper surface.

10. A method for manufacturing an integrated chip, the method comprising:
   depositing an upper dielectric structure over a semiconductor substrate;
   etching the upper dielectric structure to form an opening extending into a top surface of the upper dielectric structure;
   depositing an outgas layer over the upper dielectric structure and within the opening;
   performing a planarization process on the outgas layer to remove excess material of the outgas layer from over the top surface of the upper dielectric structure, thereby forming an outgas structure in the upper dielectric structure;
   forming a dielectric capping layer over a top surface of the outgas structure and the upper dielectric structure;
   forming a plurality of stopper structures extending through the upper dielectric structure and the dielectric capping layer; and
   bonding a microelectromechanical systems (MEMS) substrate to the semiconductor substrate.

11. The method of claim 10, wherein the outgas structure comprises a material having a non-crystalline structure.

12. The method of claim 10, wherein while forming the plurality of stopper structures the dielectric capping layer remains in place along the top surface of the outgas structure, and wherein the dielectric capping layer is removed from the top surface of the outgas structure before bonding the MEMS substrate to the semiconductor substrate.

13. The method of claim 10, wherein the outgas layer is deposited by a plasma-enhanced chemical vapor deposition (PECVD) process using silane tetrahydride.

14. The method of claim 13, wherein the PECVD process reaches a maximum temperature which is greater than a maximum temperature reached while bonding the MEMS substrate to the semiconductor substrate.

15. A method for manufacturing an integrated chip, the method comprising:
   forming an interconnect structure over a semiconductor substrate;
   forming a passivation structure over the interconnect structure;
   forming an outgas layer in the passivation structure, wherein the outgas layer comprises an outgas material with an outgas depletion temperature;
   forming a capping structure comprising a first cavity and a second cavity;
   forming a microelectromechanical systems (MEMS) substrate comprising a first moveable structure and a second moveable structure;
   performing a first bonding process to bond the MEMS substrate to the capping structure, wherein the first bonding process reaches a first maximum bonding temperature less than the outgas depletion temperature; and
   performing a second bonding process to bond the MEMS substrate to the interconnect structure, wherein the first cavity overlies the first moveable structure and the second cavity overlies the second moveable structure, wherein the second bonding process reaches a second maximum bonding temperature less than the outgas depletion temperature, and wherein the second bonding process seals the first cavity with a first gas pressure and seals the second cavity with a second gas pressure.

16. The method of claim 15, wherein the second maximum bonding temperature is about 420 degrees Celsius and the outgas depletion temperature is greater than about 570 degrees Celsius.

17. The method of claim 15, wherein forming the outgas layer comprises:
   forming an outgas layer opening in the passivation structure;
   depositing an outgas structure over the passivation structure, wherein the outgas structure is deposited by plasma-enhanced chemical vapor deposition (PECVD) using a precursor gas; and
   performing a planarization process on the outgas structure, thereby defining the outgas layer.

18. The method of claim 17, wherein the precursor gas is silane ($SiH_4$) and the outgas layer comprises hydrogenated amorphous silicon.

19. The method of claim 15, wherein the first bonding process comprises a fusion bonding process and the second bonding process comprises a eutectic bonding process.

20. The method of claim 15, wherein the first maximum bonding temperature is less than the second maximum bonding temperature.

* * * * *